United States Patent
Miller

(10) Patent No.: US 7,459,986 B2
(45) Date of Patent: *Dec. 2, 2008

(54) METHOD AND APPARATUS FOR REJECTING COMMON MODE SIGNALS ON A PRINTED CIRCUIT BOARD AND METHOD FOR MAKING SAME

(75) Inventor: Dennis J. Miller, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 193 days.

This patent is subject to a terminal disclaimer.

(21) Appl. No.: 11/221,374

(22) Filed: Sep. 6, 2005

(65) Prior Publication Data

US 2006/0055484 A1  Mar. 16, 2006

Related U.S. Application Data

(63) Continuation of application No. 10/367,265, filed on Feb. 14, 2003, now Pat. No. 6,956,444.

(51) Int. Cl.
*H04B 3/28* (2006.01)
(52) U.S. Cl. ......................................... 333/12; 333/245
(58) Field of Classification Search ................... 333/12, 333/245, 25–26, 24 R, 247, 185
See application file for complete search history.

(56) References Cited

U.S. PATENT DOCUMENTS

| | | | | |
|---|---|---|---|---|
| 4,359,782 A | * | 11/1982 | Hallford | ...... 455/327 |
| 5,138,287 A | * | 8/1992 | Domokos et al. | ...... 333/12 |
| 5,786,739 A | | 7/1998 | Paul et al. | |
| 5,930,686 A | | 7/1999 | Devlin et al. | |
| 5,970,138 A | * | 10/1999 | Suda et al. | ...... 379/412 |
| 5,986,521 A | | 11/1999 | Tada et al. | |
| 6,016,089 A | * | 1/2000 | Goudie | ...... 333/181 |
| 6,118,978 A | | 9/2000 | Ihmels | |
| 6,307,458 B1 | * | 10/2001 | Zhang et al. | ...... 336/200 |
| 6,448,873 B1 | * | 9/2002 | Mostov | ...... 333/185 |
| 6,525,694 B2 | * | 2/2003 | Jiang et al. | ...... 343/742 |
| 6,587,013 B1 | * | 7/2003 | Arlin et al. | ...... 333/101 |
| 6,788,171 B2 | * | 9/2004 | Ammar et al. | ...... 333/247 |
| 2004/0070468 A1 | * | 4/2004 | Harada | ...... 333/185 |
| 2004/0155720 A1 | * | 8/2004 | Yasui et al. | ...... 333/12 |

OTHER PUBLICATIONS

Patent No. 6,956,444, Office Action dated Oct. 21, 2004, 4 pages.

(Continued)

*Primary Examiner*—Dinh T. Le
(74) *Attorney, Agent, or Firm*—Blakely, Sokoloff, Taylor & Zafman LLP

(57) ABSTRACT

In one embodiment, the invention is an apparatus. The apparatus includes a pair of parallel traces on a first level of a PCB (printed circuit board). The apparatus also includes a stub on a second level of the PCB. The stub is parallel to the pair of parallel traces. The stub is physically disconnected from the pair of parallel traces. The stub has a predetermined length based on an expected frequency. The stub is formed of an electrically conductive material.

5 Claims, 9 Drawing Sheets

OTHER PUBLICATIONS

Patent No. 6,956,444, Office Action dated Feb. 18, 2005, 9 pages.
Patent No. 6,956,444, Notice of Allowance dated Jun. 3, 2005, 4 pages.
Patent No. 6,956,444, Supplemental Notice of Allowance dated Jul. 18, 2005, 6 pages.
Patent No. 6,956,444, Office Action dated Feb. 18, 2005, 9 pages.

* cited by examiner

US 7,459,986 B2

METHOD AND APPARATUS FOR REJECTING COMMON MODE SIGNALS ON A PRINTED CIRCUIT BOARD AND METHOD FOR MAKING SAME

RELATED APPLICATIONS

This application is a continuation of U.S. patent application Ser. No. 10/367,265, filed Feb. 14, 2003, now U.S. Pat. No. 6,956,444 B2, issued Oct. 18, 2005.

FIELD

In various embodiments, the present invention relates to the fields of manufacture of printed circuit boards and microwave communications.

BACKGROUND

All communications using non-return-to-zero (NRZ) or frequency modulated carrier waves are susceptible to noise. However, NRZ offers many advantages, such as predictable power consumption and good range and penetration characteristics. Thus, NRZ carrier waves are often used for communications.

When a NRZ carrier wave is involved in communications on a printed circuit board and with semiconductor devices (integrated circuits), various techniques may be used to reduce noise. Often, the communications signal is transmitted as a differential signal, across two matched traces on the printed circuit board. The two matched traces each carry a signal which can be divided into two parts. Of the two parts, the differential part of the signal is what is desired and the common mode part of the signal is what is not desired.

Unfortunately, this requires that the integrated circuits reduce common mode noise received or sent along differential pairs of traces. Many integrated circuits are not effective enough at this task (reduction of common mode noise) to operate as well as desired. Moreover, constraints on the design of printed circuit boards may increase common mode noise. For example, a bend in a pair of differential traces may cause differential mode energy to be converted to common mode energy, and thus increase the common mode energy (or noise).

BRIEF DESCRIPTION OF THE DRAWINGS

The present invention is illustrated by way of example and not limitation in the accompanying figures.

Figure 1A:
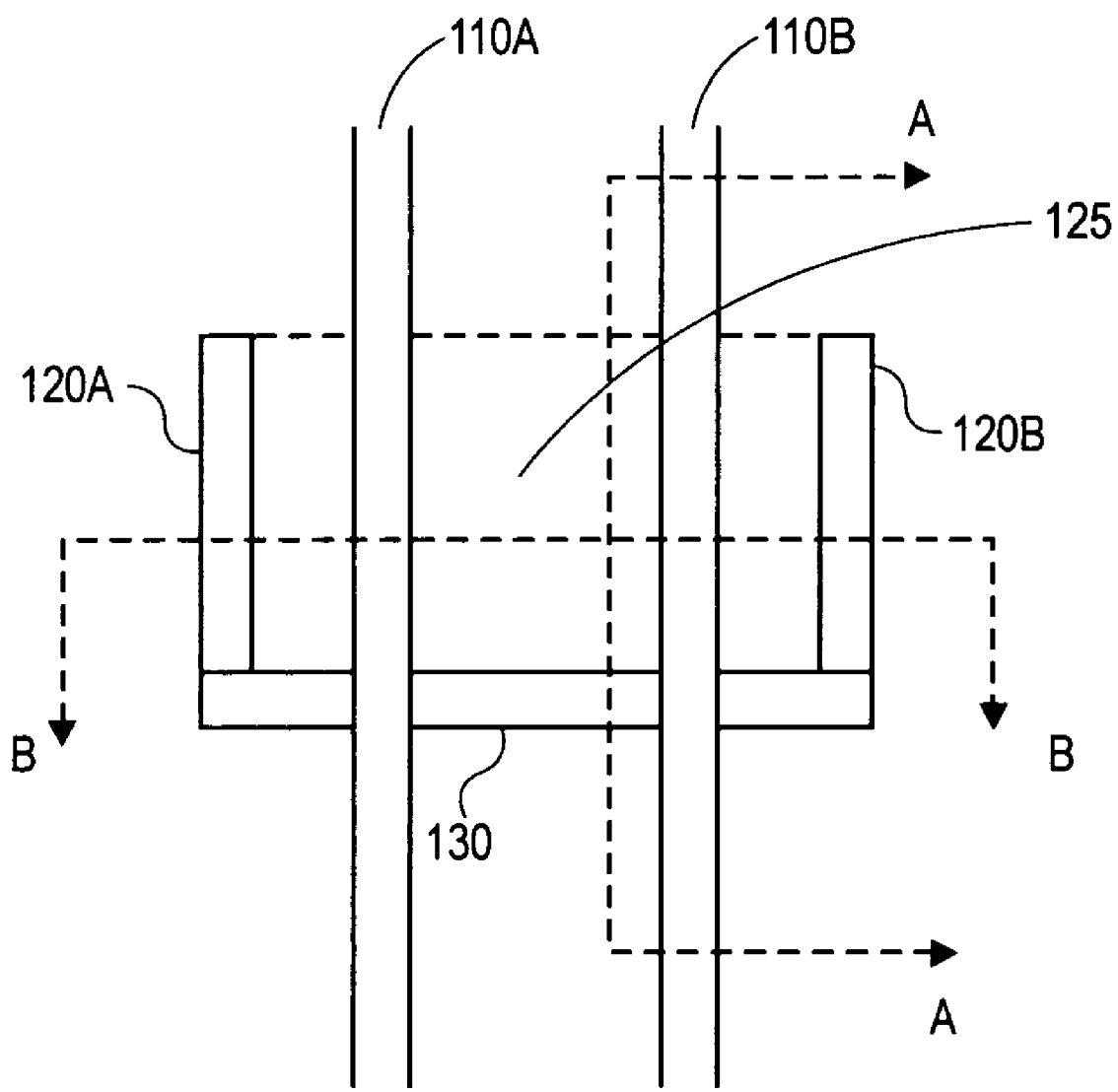
FIG. 1A illustrates an embodiment of a printed circuit board.

Other embodiments within the spirit and scope of the present invention will be apparent from the description and drawings.

DETAILED DESCRIPTION

A method and apparatus for rejecting common mode signals on a printed circuit board and method for making same is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments.

Various descriptions of this document relate to devices or components being coupled together. Coupling typically denotes a relationship allowing for communication or connection between a first and second object. The first object may be directly connected to the second object. Alternatively, the first object may be directly connected to a third object which may also be directly connected to the second object, thereby achieving a coupling between the first object and the second object. As will be appreciated, the number of intermediate objects between two objects which are coupled together does not determine whether the objects are coupled, the presence of a link between the two objects indicates that the two objects are coupled together. Note that objects in the figures are generally not illustrated to scale.

Various approaches to reducing or eliminating common mode noise on a printed circuit board (PCB) may be used. However, most of these approaches require additional components and circuits which increase PCB complexity, yield problems, and cost. In one embodiment, a design for a PCB is presented which does not require additional components (such as added inductors, capacitors, resistors or other components) and which does not add too much design complexity. The embodiment includes a normal pair of differential traces, a stub parallel to the differential traces. The stub is on a different level of the PCB, and thus not physically connected to the differential traces. However, the stub acts as a band-reject filter for the differential traces, effectively reflecting back (and thereby reducing) common mode signals of the differential traces.

In one embodiment, the invention is an apparatus. The apparatus includes a pair of parallel traces on a first level of a PCB (printed circuit board). The apparatus also includes a stub on a second level of the PCB. The stub is parallel to the pair of parallel traces. The stub is physically disconnected from the pair of parallel traces. The stub has a predetermined length based on an expected frequency. The stub is formed of an electrically conductive material.

In an alternate embodiment, the invention is a method. The method includes fabricating a portion of a PCB. The method further includes fabricating a first level. The first level includes a pair of parallel conductors. The pair of parallel conductors is parallel to the stub. The pair of parallel conductors is disconnected from the stub. The method also includes fabricating an intermediate portion of the PCB. The method further includes fabricating a second level of the PCB including a stub. The stub is formed of a conductive material. The stub has a predetermined length based on an expected frequency. The method also includes finishing the PCB.

In another alternate embodiment, the invention is a method. The method includes receiving a microwave signal in a pair of conductors on a PCB. The method also includes reflecting a common mode portion centered around a predetermined frequency of the microwave signal with a stub of the PCB. The stub is parallel to the pair of conductors. The stub is physically disconnected from the pair of conductors. The stub is tuned to the predetermined frequency. The method further includes transmitting a differential mode portion of the microwave signal along the pair of conductors.

In yet another alternate embodiment, the invention is an apparatus. The apparatus includes means for transmitting a differential mode signal across a PCB. The apparatus also includes means for reflecting a common mode signal associated with the differential mode signal. The means for reflecting is incorporated within the PCB. The means for reflecting is customized for a predetermined frequency or frequency range.

FIG. 1A illustrates an embodiment of a printed circuit board. The PCB includes traces 110A and 110B, which collectively are intended to transmit a differential signal. Parallel to traces 110A and 110B is stub 125, which is located on a different level of the PCB. Bounding stub 125 are cuts 120A and 120B and cut 130. Each of cuts 120A and 120B run parallel to traces 110A and 110B. The end of cut 120A is connected to a first end of cut 130 and the end of cut 120B is connected to a second end of cut 130.

The structure illustrated can operate as a band-reject filter. As illustrated, the length of stub 125 should e set to a precise predetermined length to achieve a predictable rejection of predetermined frequencies. For example, for a transmission frequency of 2.0 GHz, and a dielectric constant of the PCB of 4.0, a wavelength of approximately 3 inches maybe expected. The predetermined length should be one quarter of the wavelength of the frequency to be rejected, yielding a predetermined length of 0.75 inches (3 inches/4). Thus, a structure in which the length of stub 125 is set to 0.75 inches will tend to reject common mode signals traveling along traces 110A and 110B at approximately 2 GHz. Similarly, for a 3.25 GHz frequency a wavelength would then be about 1.85 inches. Dividing this wavelength by 4 provides a stub length of about 0.46 inches for purposes of rejecting common mode energy near 3.25 GHz. In one embodiment, the PCB material is FR4 and the predetermined frequency is 3.25 GHz. In another embodiment, the PCB material is NELKO and the predetermined frequency is 2.4 GHz.

Figure 1B:
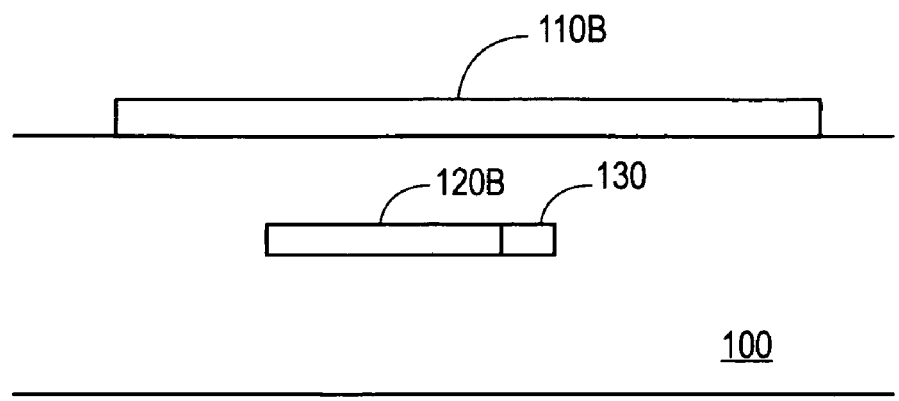
FIG. 1B illustrates a cross-sectional view of the printed circuit board of FIG. 1A along the line labeled A-A.
Figure 1C:
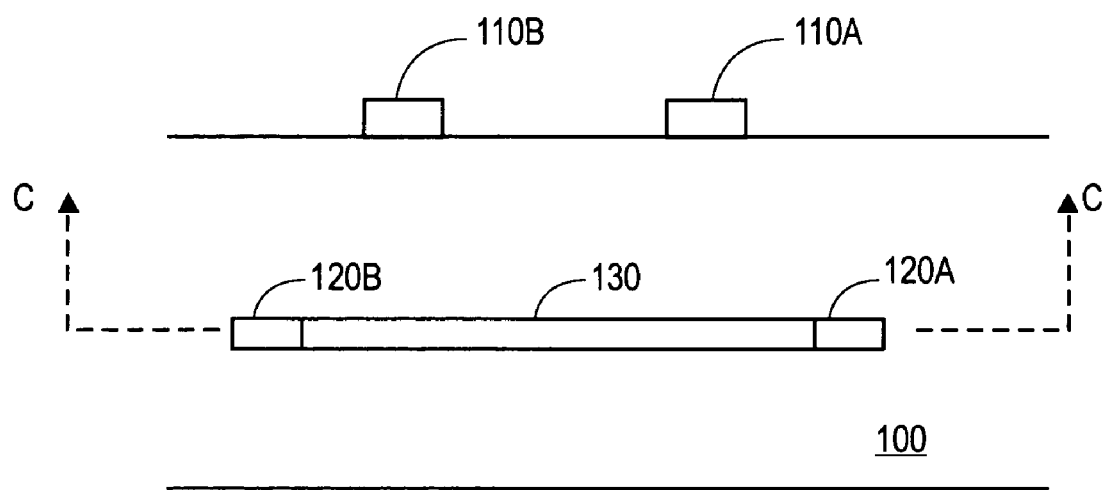
FIG. 1C illustrates a cross-sectional view of the printed circuit board of FIG. 1A along the line labeled B-B.

This structure may be understood with reference to other views. FIG. 1B illustrates a cross-sectional view of the printed circuit board of FIG. 1A along the line labeled A-A. Thus, cuts 120B and 130 are illustrated on a second level with trace 110B on a first level, without physical connections between trace 110B and stub 125. Similarly, FIG. 1C illustrates a cross-sectional view of the printed circuit board of FIG. 1A along the line labeled B-B. Here, it is more apparent that stub 125 is on the second level, and is separate from traces 110A and 110B on the first level. In both figures, it is apparent that traces 110A, 110B, and stub 125 are all parallel.

Figure 1D:
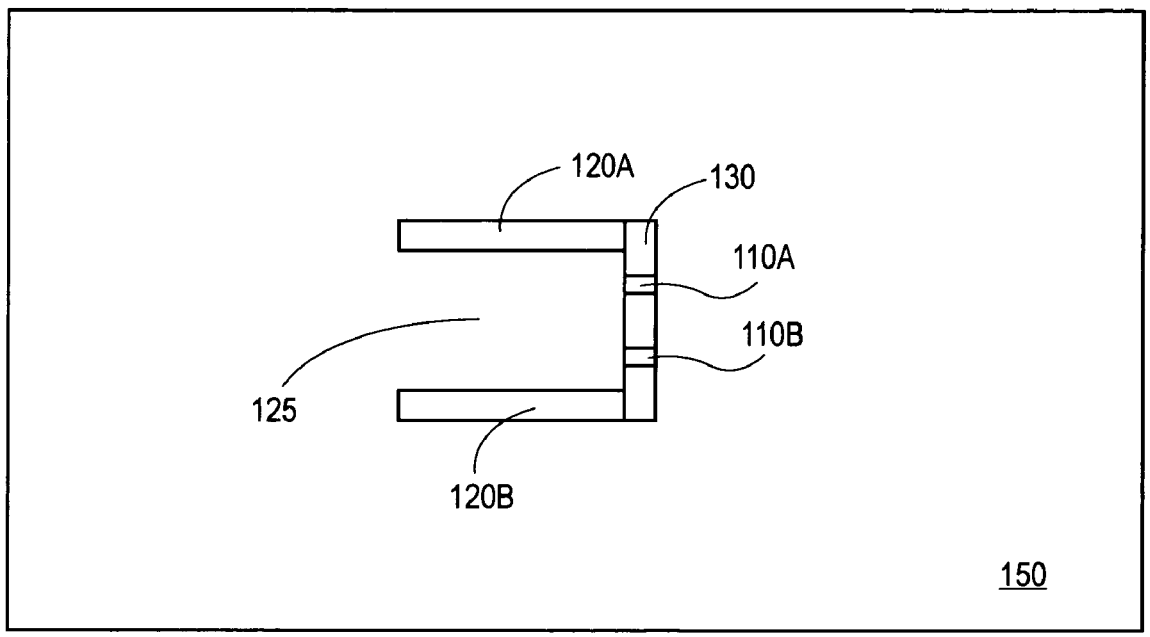
FIG. 1D illustrates a cross-sectional view of the printed circuit board of FIGS. 1A and 1C along the line labeled C-C.

An additional view of the PCB may also be useful. FIG. 1D illustrates a cross-sectional view of the printed circuit board of FIGS. 1A and 1C along the line labeled C-C. From the cross-sectional view along C-C, it is apparent that the second level is used for a plane 150, which may be a power or ground plane for example. On that second level is stub 125. Below that second level in this view is the first level, including traces 110A and 110B.

Figure 2B:
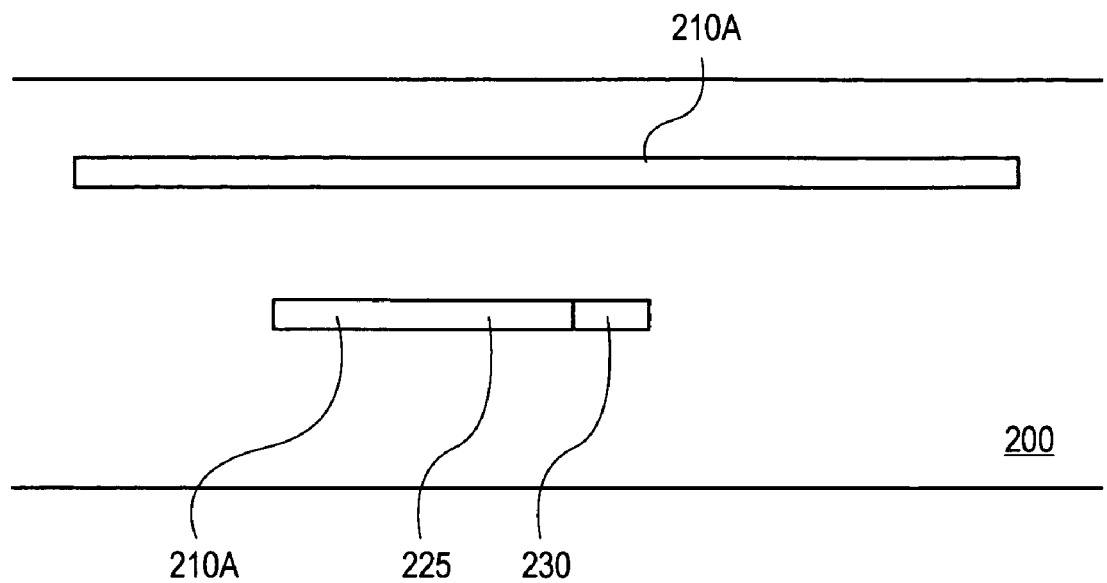
FIG. 2B illustrates a cross-sectional view of an alternative embodiment of a printed circuit board.
Figure 2C:
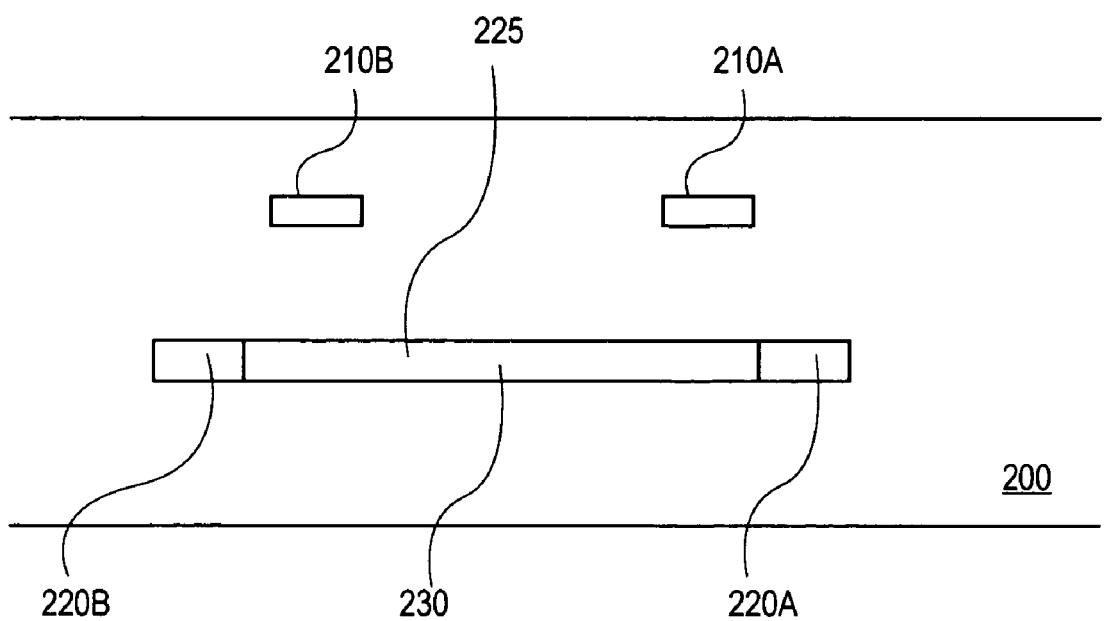
FIG. 2C illustrates a cross-sectional view of the alternative embodiment of FIG. 2B.

Alternate embodiments in which portions of the structure are rearranged will still provide similar performance characteristics. FIG. 2B illustrates a cross-sectional view of an alternative embodiment of a printed circuit board. The trace 210A is illustrated as enclosed within the PCB 200, along with the cut 220A and the cut 230 forming stub 225. Again, the length of the stub 225 determines the frequency of the band-reject filter. FIG. 2C illustrates a cross-sectional view of the alternative embodiment of FIG. 2B. As is apparent, traces 210A and 210B are the differential traces on a first level, and stub 225 is on a second level. Stub 225 is parallel to traces 210A and 210B.

Figure 3B:
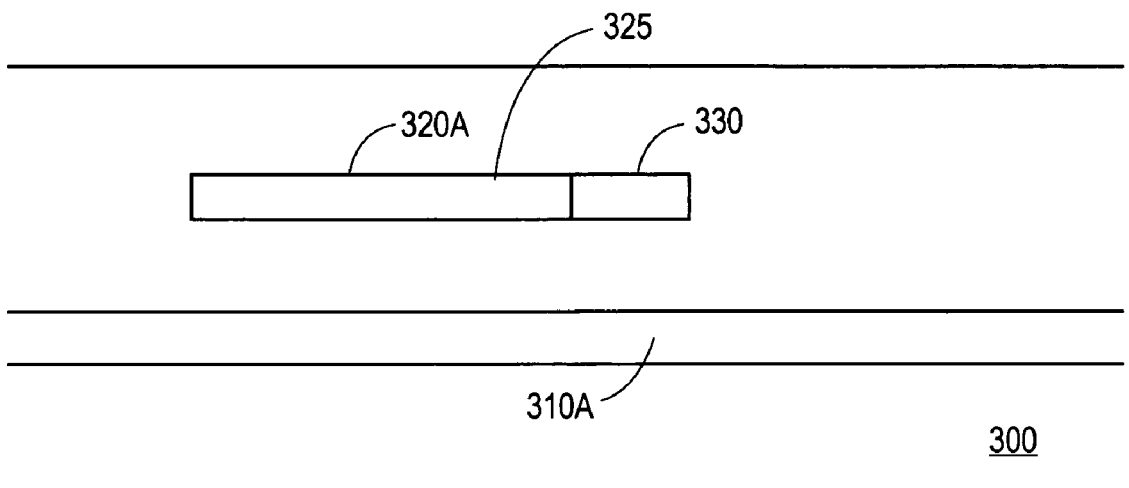
FIG. 3B illustrates a cross-sectional view of another alternative embodiment of a printed circuit board.
Figure 3C:
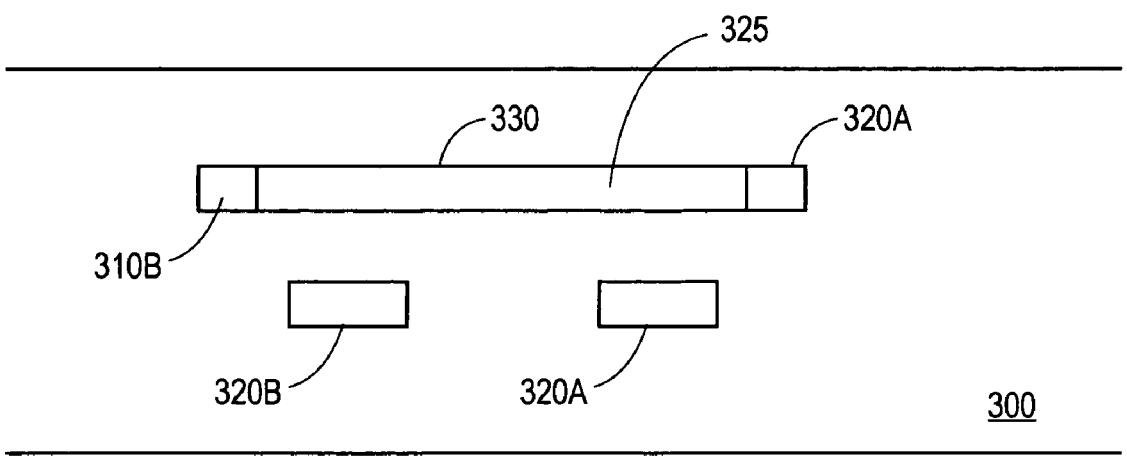
FIG. 3C illustrates a cross-sectional view of the alternative embodiment of FIG. 3B.

Yet another alternate embodiment may also be instructive. FIG. 3B illustrates a cross-sectional view of another alternative embodiment of a printed circuit board. The trace 310A is illustrated as enclosed within the PCB 300 on a first level, along with the cut 320A and the cut 330 forming stub 325 on a second, higher level. The orientation (which level is 'higher') is not important to the operation of the band-reject filter. FIG. 3C illustrates a cross-sectional view the alternative embodiment of FIG. 3B. Similarly to other embodiments, traces 310A and 310B are the differential traces on a first level, stub 325 is on a second level. Stub 325 is parallel to traces 310A and 310B. The length of stub 325 determines the center frequency of the band-reject filter.

Figure 4C:
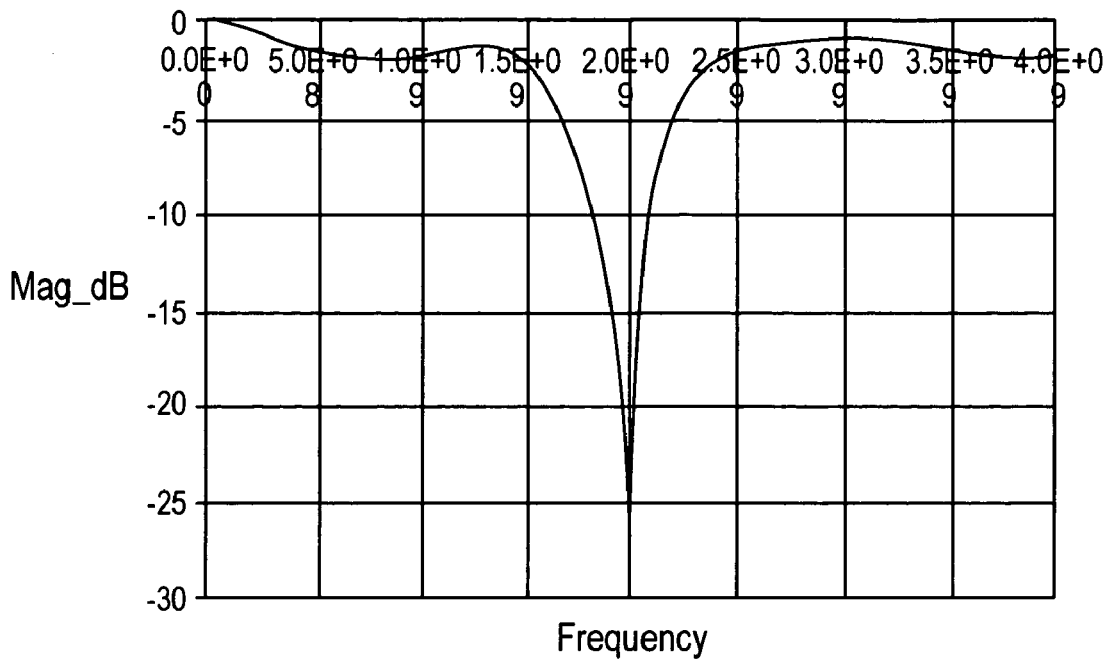
FIG. 4C is a graph illustrating a common mode response of a filter.
Figure 4D:
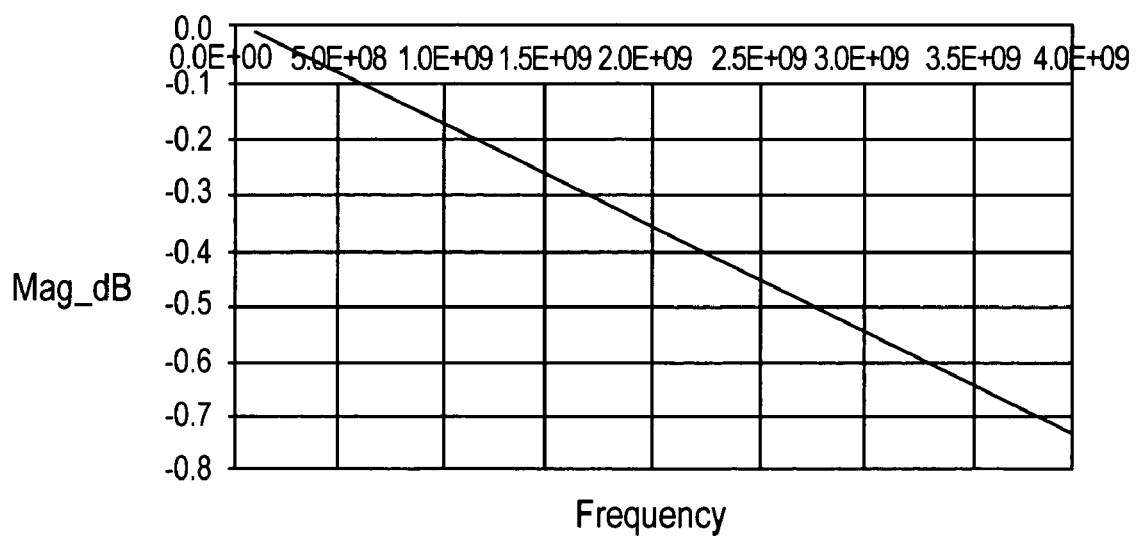
FIG. 4D is a graph illustrating a differential mode response of a filter.

Simulations of the structures illustrated provide evidence of the usefulness of these structures. FIG. 4C is a graph illustrating a common mode response of a filter. The data reflects that the common mode signal throughput drops off by several orders of magnitude around the center frequency of 2.0 GHz. Effectively, the filter rejects common-mode signals around the 2.0 GHz center frequency. FIG. 4D is a graph illustrating a differential mode response of a filter. The differential mode transmission of signals is relatively stable across a much wider range of frequencies, without the common mode rejection illustrated in FIG. 4C. At 2.0 GHz, the loss of signal strength is only about 0.4 dB, and at lower level frequencies (where differential signals are likely to be), the loss of signal strength is around or below 0.1 to 0.2 dB.

Figure 5:
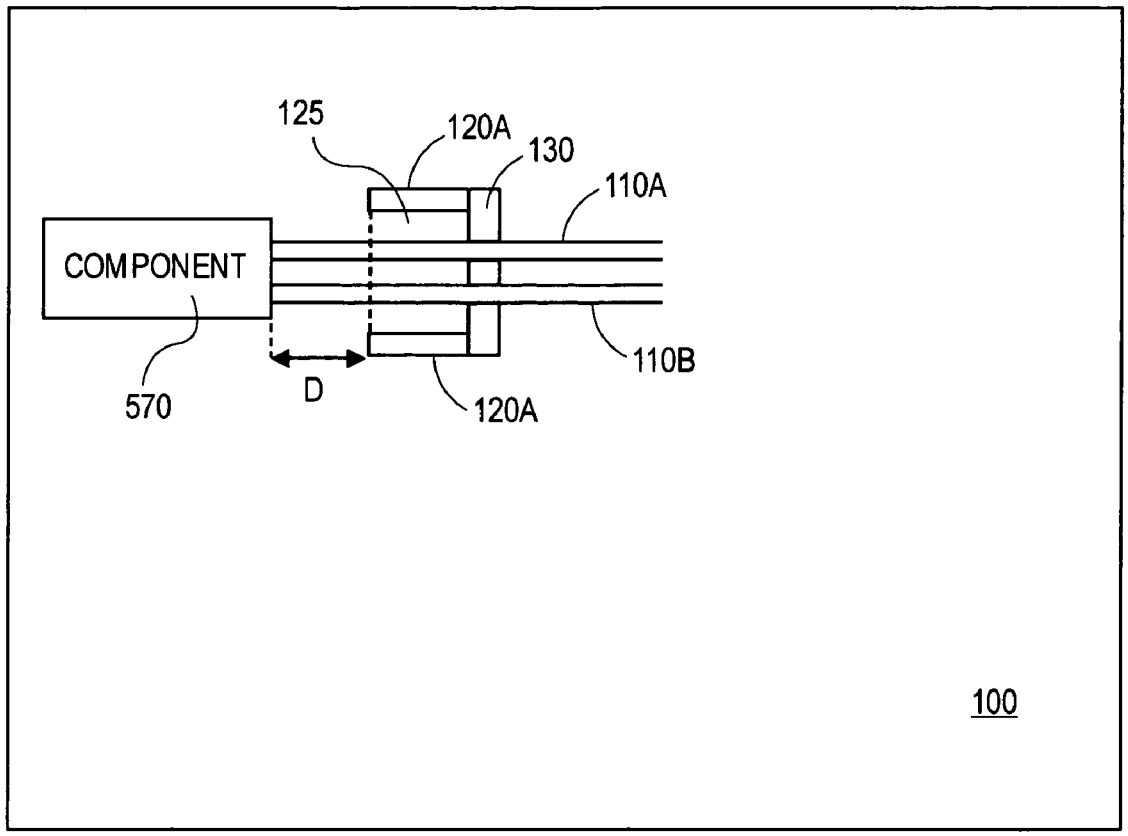
FIG. 5 illustrates an embodiment of a printed circuit board.

Given the performance of the filter, incorporating it into a design is a good choice. FIG. 5 illustrates an embodiment of a printed circuit board. PCB 100 includes the previously described traces 110A, 110B, and cuts 120A, 120B and 130 which define stub 125. Also illustrated is component 570, which is connected to traces 110A and 110B. Component may be a transmitter, a receiver, or some other component which operates with high frequency differential signals. The distance D between the component 570 and the end of stub 125 is preferably a relatively small distance, even within other constraints of the design of PCB 100. Note that this preference is based on expected real world effects, as the common mode portion of the signal will be reflected by the filter. The ideal models for such components suggest that the distance D will not be a factor, and this may be true for some designs.

If component 570 is a transmitter, then the common mode noise produced by component 570 will be reduced by the filter. Similarly, if component 570 is a receiver, then the common mode noise received by component 570 will be reduced by the filter (and thus allow for greater sensitivity to common mode noise on the part of component 570). If the component 570 is some form of port (such as a connector to a cable for example), the common mode noise both entering and exiting the board will be reduced.

Figure 6:
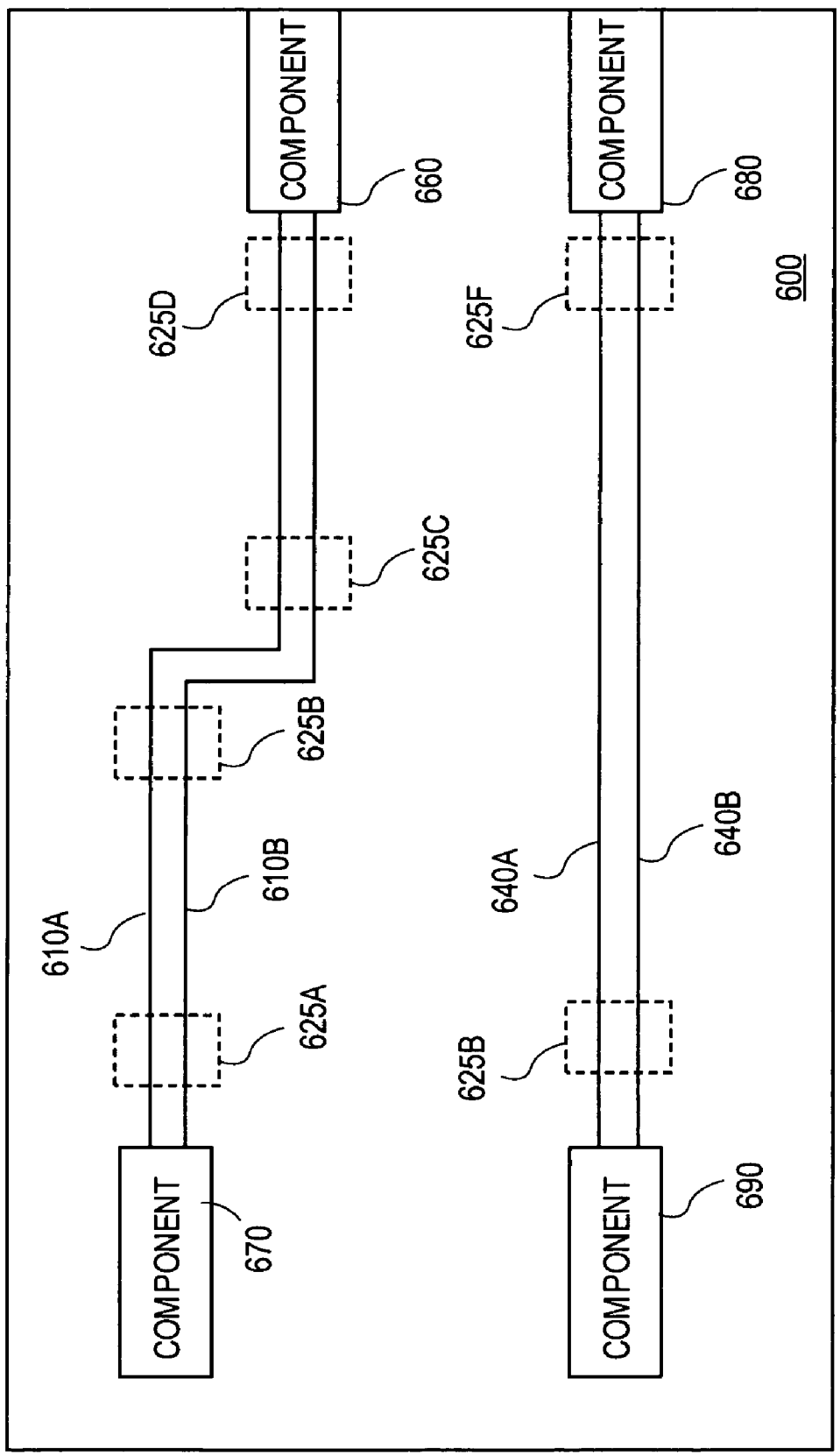
FIG. 6 illustrates an alternative embodiment of a printed circuit board.

Design choices for a PCB may indicate various locations for a filter. FIG. 6 illustrates an alternative embodiment of a printed circuit board. PCB 600 includes four components, components 660, 670, 680 and 690. Each of components 660, 670, 680 and 690 may be a different type of component. Examples of potential components include but are not limited to a port or connector, a receiver, a transmitter, a transceiver, or some other form of integrated circuit. Between component 660 and component 670 run a pair of differential traces 610A and 610B, each having approximately the same length and width. Depending on constraints of designing PCB 600, any one or more of locations 625A, 625B, 625C or 625D may make sense for location of a band-reject filter such as that illustrated in FIG. 1A for example.

Similarly, running between components 680 and 690 is a pair of differential traces 640A and 640B. Again, depending on design constraints for PCB 600, one of locations 625E or 625F may make sense for a band-reject filter. Note that placement of multiple filters along a single pair of differential traces involves potentially complicated interactions between the two (or more) filters and the differential traces, but two filters tuned to different frequencies may be particularly useful for a pair of differential traces in some embodiments.

Figure 7:
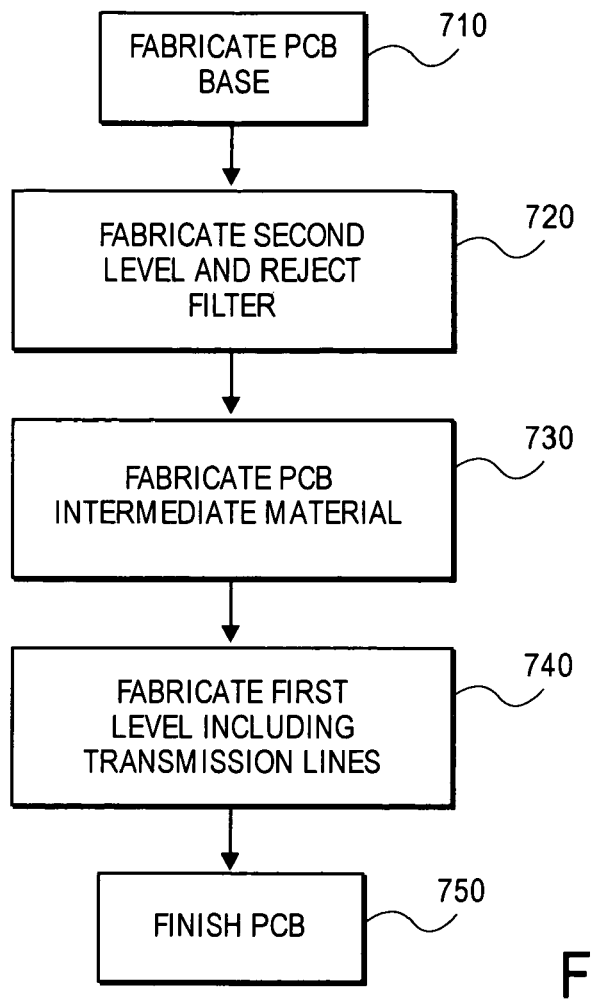
FIG. 7 illustrates an embodiment of a method of making a printed circuit board.

General PCB fabrication is known, and may be applied in fabrication of the band-reject filter. FIG. 7 illustrates an embodiment of a method of making a printed circuit board. At block 710, the PCB base (and any lower-level layers) are fabricated. At block 720, the second level, including the band-reject filter, is fabricated. At block 730, intervening levels or material are fabricated on the PCB. At block 740, the first level, including the transmission traces (differential traces), is fabricated, without physically connecting the transmission traces to the band-reject filter traces. At block 750, the PCB is finished, such as by fabricating additional levels or by sealing the PCB against some environmental wear for example.

Note that the effects of the filter are based on not having an intervening plane (ground or power) between the filter (stub) and the traces to be filtered. While it may be possible to achieve similar effects under other circumstances (such as with an intervening power plane for example), this would be difficult to demonstrate due to the overwhelming complexity of the analysis required. Using two stubs may have some additional effects. With two stubs aligned on top of each other, a slight variation in the length of the two stubs may allow for a wider filter. Having two stubs which are positioned at different locations along the same pair of conductors will likely cause the common mode energy to bounce back and forth between the two stubs, thus potentially causing problems.

Figure 8:
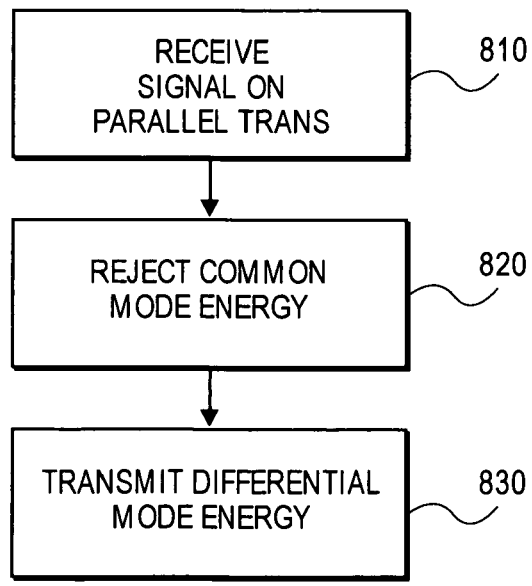
FIG. 8 illustrates an embodiment of a method of using a filter on a printed circuit board.

FIG. 8 illustrates an embodiment of a method of using a filter on a printed circuit board. At block 810, a signal is received on a pair of parallel traces. At block 820, the signal encounters the band-reject filter, and common mode components of the signal near the center frequency of the band-reject filter are reflected back along the traces. At block 830, the differential mode portion of the signal is transmitted along the pair of traces without much loss of signal.

In the foregoing detailed description, the method and apparatus of the present invention has been described with reference to specific exemplary embodiments thereof. It will, however, be evident that various modifications and changes may be made thereto without departing from the broader spirit and scope of the present invention. In particular, the separate blocks of the various block diagrams represent functional blocks of methods or apparatuses and are not necessarily indicative of physical or logical separations or of an order of operation inherent in the spirit and scope of the present invention. The present specification and figures are accordingly to be regarded as illustrative rather than restrictive.

What is claimed is:

1. An apparatus, comprising:
    a pair of conductors for transmitting a microwave signal across a PCB (printed circuit board), the microwave signal having a common mode portion centered around a predetermined frequency; and
    means for removing the common mode portion centered around the predetermined frequency of the microwave signal, the means for removing being part of the PCB and having at least one size parameter dependent on the predetermined frequency, the means for removing comprising a stub formed on an electrically conductive material, the stub being parallel to the pair of conductors on the PCB and being physically separated from the pair of conductors.

2. The apparatus of claim 1 wherein:
    the PCB is FR4 and the predetermined frequency is 3.25 GHz.

3. The apparatus of claim 1 wherein:
    the predetermined frequency is 2.4 GHz.

4. The apparatus of claim 1 wherein the PCB comprises a first layer and a second layer, the first layer including the pair of conductors and the second layer including the stub.

5. The apparatus of claim 1 wherein the at least one size parameter is a length.

* * * * *